United States Patent
Ebine

(10) Patent No.: US 7,361,027 B2
(45) Date of Patent: Apr. 22, 2008

(54) CONTACT STRUCTURE, DISPLAY DEVICE AND ELECTRONIC DEVICE

(75) Inventor: Hideyuki Ebine, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/741,999

(22) Filed: Dec. 19, 2003

(65) Prior Publication Data

US 2004/0135258 A1      Jul. 15, 2004

(30) Foreign Application Priority Data

Dec. 25, 2002   (JP) .............................. 2002-375440

(51) Int. Cl.
*H01R 12/00*   (2006.01)
(52) U.S. Cl. .................. 439/67; 439/492; 439/668; 257/E21.506
(58) Field of Classification Search .................. 257/57, 257/59, 72, 83, 211, 503; 439/67, 77, 78, 439/492, 668
See application file for complete search history.

(56) References Cited

U.S. PATENT DOCUMENTS

| | | | |
|---|---|---|---|
| 4,780,794 A | 10/1988 | Mase et al. | |
| 4,820,612 A | 4/1989 | Mase et al. | |
| 4,828,967 A | 5/1989 | Mase et al. | |
| 5,608,559 A | 3/1997 | Inada et al. | |
| 5,636,329 A | 6/1997 | Sukegawa et al. | |
| 5,821,159 A | 10/1998 | Ukita | |
| 5,904,860 A * | 5/1999 | Nagakubo et al. | 216/34 |
| 6,043,859 A | 3/2000 | Maeda | |
| 6,051,883 A * | 4/2000 | Nakamura | 257/768 |
| 6,072,556 A | 6/2000 | Hirakata et al. | |
| 6,169,593 B1 | 1/2001 | Kanaya et al. | |
| 6,215,077 B1 | 4/2001 | Utsumi et al. | |
| 6,239,854 B1 | 5/2001 | Hirakata et al. | |
| 6,383,327 B1 | 5/2002 | Mase | |
| 6,404,476 B1 | 6/2002 | Mase | |

(Continued)

FOREIGN PATENT DOCUMENTS

JP          08-227079          9/1996

(Continued)

*Primary Examiner*—Wai-Sing Louie
(74) *Attorney, Agent, or Firm*—Cook, Alex, McFarron, Manzo, Cummings & Mehler, Ltd.

(57) ABSTRACT

A contact that takes a structure to laminate a protective conductive film over a metal film has a high hardness of the protective conductive film; therefore, a damage of contact surface made by contacting with an electrode of an inspection apparatus can be prevented in an inspection before boding FPC. However, the protective conductive film has higher resistivity compared to the metal film; therefore, contact resistivity with FPC gets higher, and power consumption gets bigger in the condition of using the display device. The present invention provides a contact structure, wherein a structure of FPC contact is formed of a layered film of the metal film and the protective conductive film, and a conductive particle included in an anisotropic conductive film is formed of the protective conductive film in a slit shape having a space wider than a width necessary for an electrical connection with the metal film and a space narrower than a width of an electrode of an inspection apparatus and can be electrically connected with the FPC in both of the protective conductive film and the metal film, and a display device having the contact structure.

34 Claims, 9 Drawing Sheets

U.S. PATENT DOCUMENTS

| | | |
|---|---|---|
| 6,567,146 B2 | 5/2003 | Hirakata et al. |
| 6,670,940 B2 * | 12/2003 | Kim .......................... 345/98 |
| 6,729,888 B2 * | 5/2004 | Imaeda ....................... 439/66 |
| 6,760,091 B2 * | 7/2004 | Uehara ...................... 349/152 |
| 2002/0189862 A1 * | 12/2002 | Miyake et al. .............. 174/262 |

FOREIGN PATENT DOCUMENTS

| | | |
|---|---|---|
| JP | 11-125837 | 5/1999 |
| JP | 2001-093598 | 4/2001 |

* cited by examiner

CONTACT STRUCTURE, DISPLAY DEVICE AND ELECTRONIC DEVICE

BACKGROUND OF THE INVENTION

1. Field of the Invention

The present invention relates to a contact structure for connecting a circuit composed of a thin film transistor (hereinafter referred to as TFT) with a circuit over another substrate. Also, the present invention relates to a semiconductor device such as a display device utilizing such a contact structure. Especially, the present invention provides a technique that can be appropriately utilized for a liquid crystal display device and an electroluminescence (EL) display device that provided over one substrate a driving circuit set at a pixel portion and its periphery; a display device that formed together CPU, memory, data processing circuit, and the like over one substrate with the device; and furthermore, electronics that mounted these display devices. Note that, in the present specification, a display device refers to an overall display device that operate by utilizing a characteristic of a semiconductor, and not only the liquid crystal display device and the EL display device, but also the electronic device that mounted the display device are included into its category.

2. Description of the Related Art

Conventionally, the contact has been mainly formed in a laminated structure of a metal film and a protective conductive film over a substrate (for instance, Patent Document 1 can be referred) in the case of connecting electrically a connection wiring over a substrate with another wiring over a substrate by an anisotropic conductive film.

A method for connecting a substrate and a flexible printed circuit (FPC) is described using a cross-sectional view of a contact portion shown in the Patent Document 1. As shown in FIG. 3, an FPC 104 is formed of a substrate 105 and a wiring 106. A contact that laminates a metal film 102 and a protective conductive film 103 is formed over a substrate 101. An interlayer insulating film 109 and a protective film 110 are formed on a periphery of the contact to protect the metal film 102. The contact over the substrate 101 and the wiring 106 over the FPC 104 are connected by bonding using an anisotropic conductive film 107 that includes conductive particles 108.

[Patent Document 1] Japanese Patent Laid-Open No. 2001-93598

A circuit formed within a display device is performed an examination before bonding the FPC using an inspection apparatus to confirm operation of the display device in a process for manufacturing the display device. As shown in FIG. 6, an inspection apparatus 322 is composed of an external driving circuit 323 for driving a display device 311 with the purpose of inspecting; a measuring equipment 324 for measuring an electric characteristic of the display device 311; and an inspection electrode 321 for electrically connecting the display device 311, the external driving circuit 323, and the measuring equipment 324.

The inspection electrode 321 obtains an electric connection by physically contacting with a contact 120 formed on an FPC contact portion 316 over the display device 311. A signal line driving circuit 314 and a row select line driving circuit 315 formed within the display device 311 are driven using the external driving circuit 323 included in the inspection apparatus 322, and an electric characteristic of the signal line driving circuit and the row select line driving circuit 315 is measured using the measuring equipment 324 included in the inspection apparatus 322.

A contact by the conventional technique takes a structure that laminates the protective conductive film over the metal film in order to prevent corrosion and oxidation of the metal film. The protective conductive film has a high hardness; therefore, the damage of a contact surface due to a contact of the inspection apparatus 322 with the inspection electrode 321 can be prevented in the inspection during the process for manufacturing before bonding the FPC. However, the protective conductive film has high resistivity compared with that of the metal film; therefore, there is a problem that contact resistivity with the FPC gets higher and power consumption gets bigger in the condition of using the display device.

SUMMARY OF THE INVENTION

It is an object of the present invention to decrease the contact resistivity between the contact and the FPC and to prevent the damage of the contact surface, which is the above problem.

In order to solve the above problem, following means is taken in the present invention. The present invention provides a contact structure including a connection wiring to connect electrically with a wiring over other substrate by an anisotropic conductive film, wherein the connection wiring is formed of a laminated film of a metal film and protective conductive film, and the protective conductive film has a pattern in a slit shape in a connection part with the anisotropic conductive film.

In addition, the present invention provides a contact structure including a connection wiring to connect electrically with a wiring over other substrate by an anisotropic conductive film, wherein the connection wiring is formed of a laminated film of a metal film and protective conductive film, and the protective conductive film has a pattern in a slit shape in a connection part with the anisotropic conductive film and electrically connected with the anisotropic conductive film in both of the protective conductive film and the metal film.

Furthermore, the present invention, wherein a part that the protective conductive film is not formed among a pattern in a slit shape of the protective conductive film have a wider width than a space that is necessary for an electric contact by a conductive particle included in the anisotropic conductive film.

A display device of the present invention comprising a contact structure having one of a characteristic of the means.

DETAILED DESCRIPTION OF THE PREFERRED EMBODIMENTS

Embodiment Modes of the Invention

Embodiment Mode 1

Figure 3:
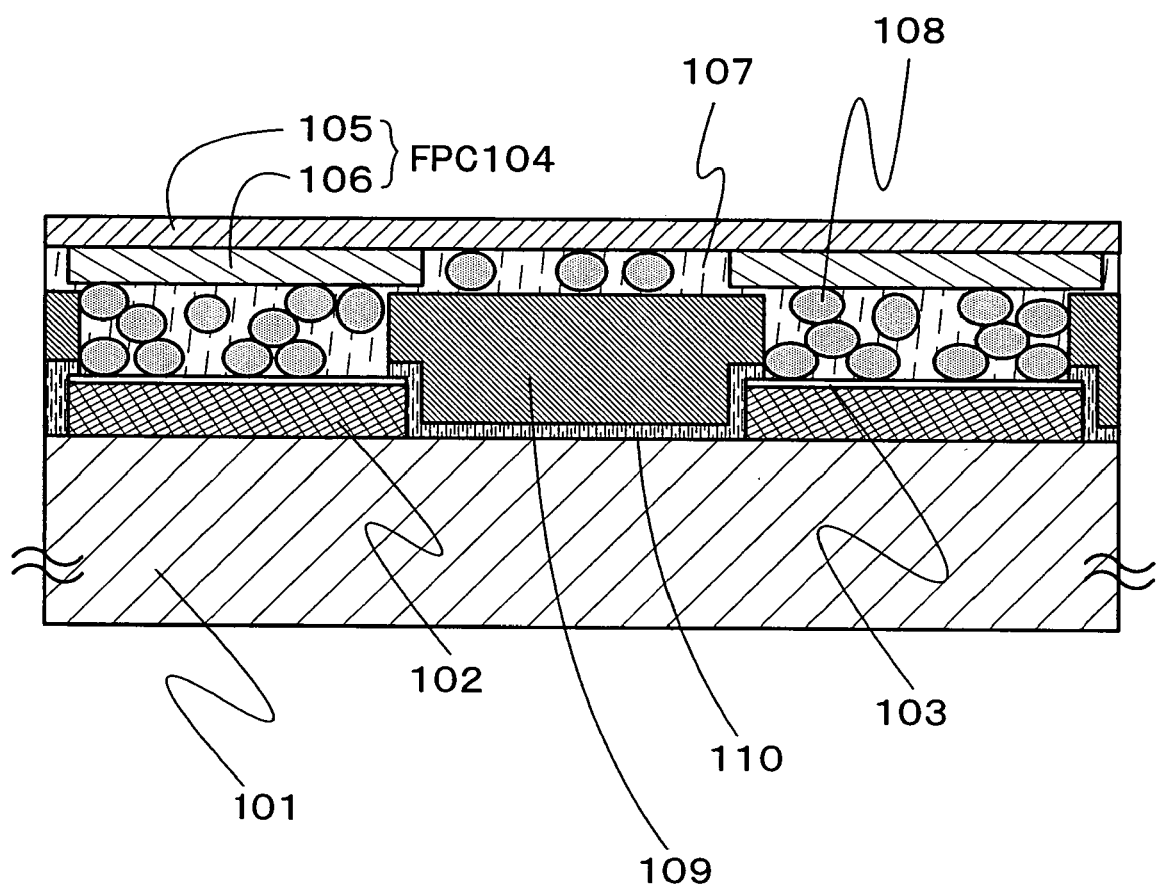
FIG. 3 is a drawing illustrating a connection between a contact and FPC using an anisotropic conductive film.
Figure 4:
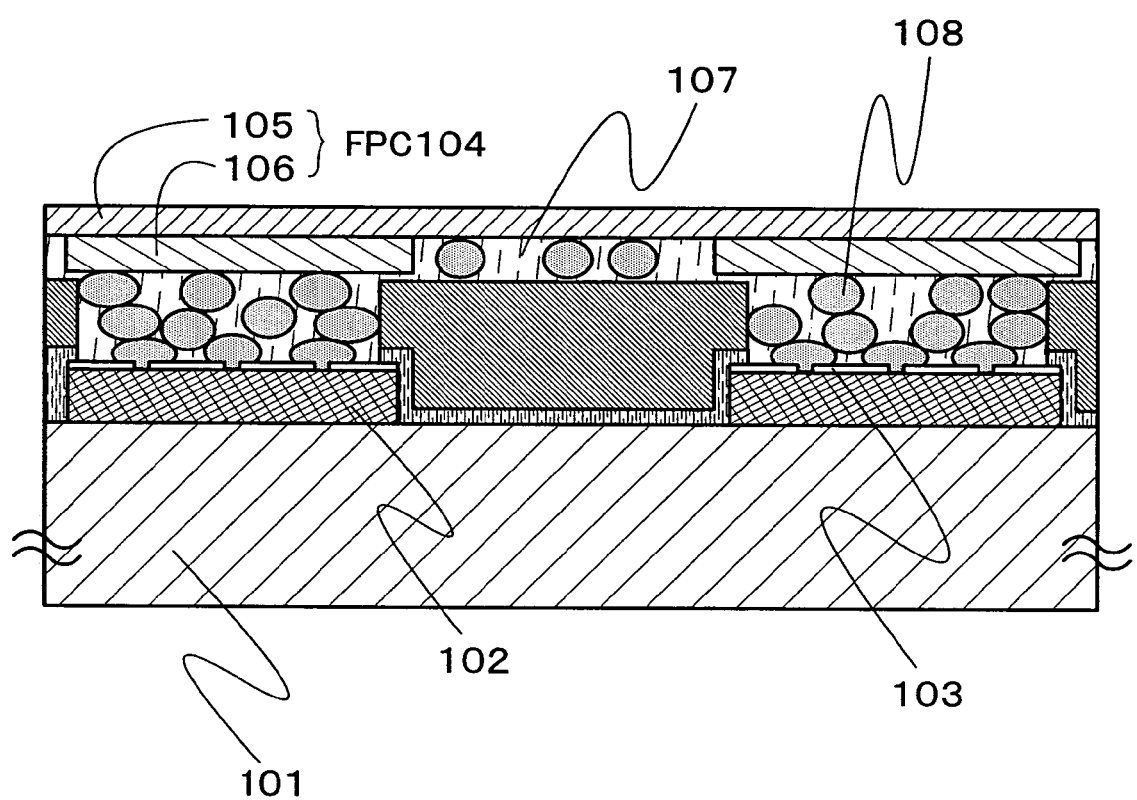
FIG. 4 is a drawing illustrating a connection between a contact and FPC of the present invention using an anisotropic conductive film.
Figure 5:
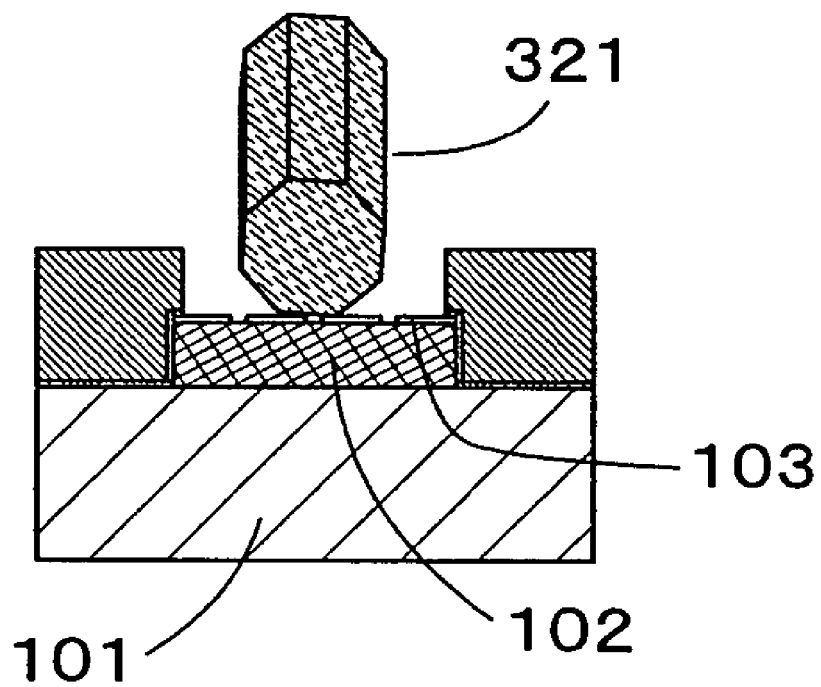
FIG. 5 is a drawing illustrating a contact between an inspection electrode of an inspection apparatus and a contact of the present invention.

A contact structure of the present invention is preferable for a display device using a method for mounting that connects a circuit by an anisotropic conductive film, for instance, an active matrix type liquid crystal display device and an EL display device. In FIGS. 2, 3 and 5, like components are denoted by like numerals as of FIG. 1 and FIG. 4.

The present embodiment mode is described referring to a display device including the signal line driving circuit and the row select line driving circuit. In the display device 311 including the signal line driving circuit 314, the row select line driving circuit 315, and a pixel 313, the signal line driving circuit 314, the row select line driving circuit 315, and the pixel 313 are connected electrically with an external apparatus of the display device 311 via the FPC, and it is necessary to receive a power and a signal that is necessary for display.

The connection between the display device 311 and the FPC is carried out in the FPC contact portion 316 formed over the display device 311. The FPC contact portion 316 is composed of a contact 120 formed with a laminated structure of a plurality of the metal films that is equally lined and a protective conductive film. The FPC contact portion 316 may be placed at a plurality of places within the display device. FIG. 4 is a cross-sectional view taken along with A-A' part of the FPC contact portion 316.

Figure 7:
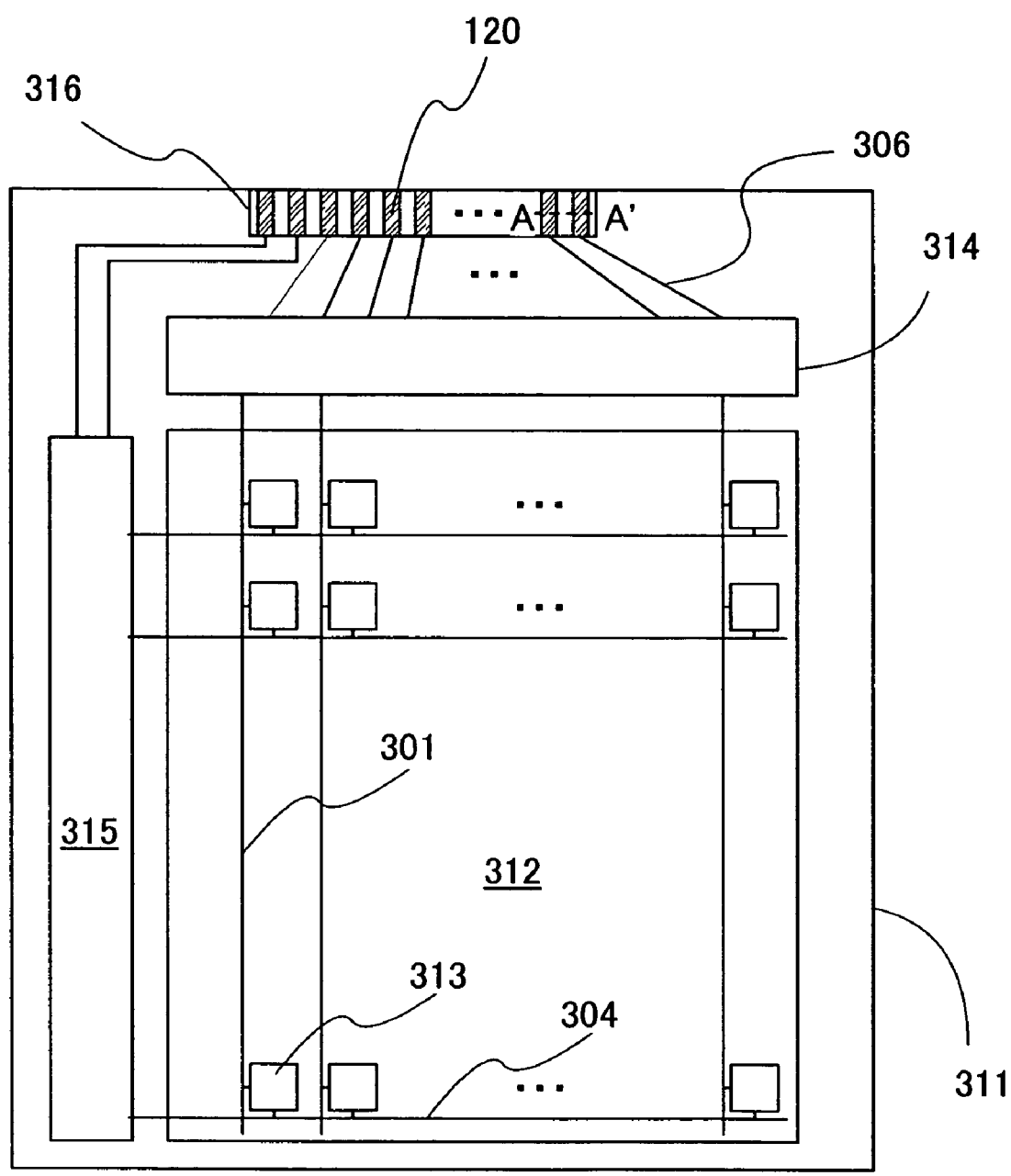
FIG. 7 is a drawing illustrating an example of a display device.

In FIG. 7, a signal of image to be displayed is transferred from the FPC contact portion 316 to the signal line driving circuit 314 through a video wiring 306, and transferred from the signal line driving circuit 314 to each of pixels 313 included in a pixel portion 312 through a signal line 301. The scanning line driving circuit 315 and each of pixels 313 are connected in a scanning line 304.

In the case of manufacturing the display device 311, an inspection is carried out to distinguish whether the display device 311 is nondefective or defective. It is necessary condition that the signal line driving circuit 314 and the row select line driving circuit 315 operate correctly so that the display device 311 including the signal line driving circuit 314 and the row select line driving circuit 315 displays correctly.

In the case of carrying out separately an operation test of the signal line driving circuit 314 and the row select line driving circuit 315, it may be during a process for manufacturing that the pixel 313 is uncompleted. Accordingly, a defective product can be found before completing the display device 311 by inspecting at the point that the signal line driving circuit 314 and the row select line driving circuit 315 are advanced to a step capable for operating. Therefore, a rest of a step for manufacturing can be omitted and a cost for manufacturing can be decreased.

Figure 6:
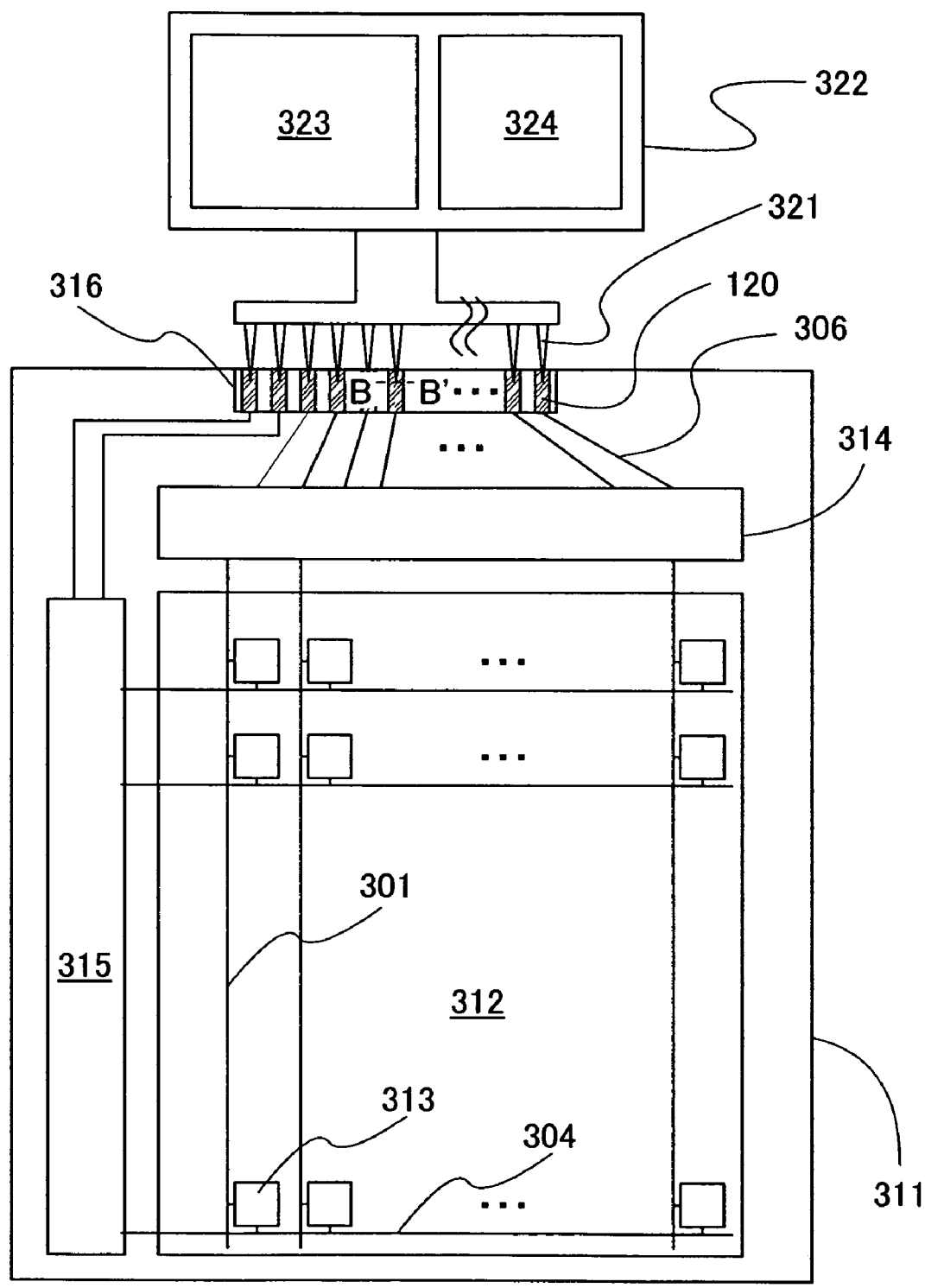
FIG. 6 is a drawing illustrating an example of an inspection apparatus and a display device.

As shown in FIG. 6, the inspection apparatus 322 is composed of the external driving circuit 323 for driving with the purpose of inspecting the display device 311; the measuring equipment 324 for measuring an electric characteristic of the display device 311; and the inspection electrode 321 for connecting the display device 311, the external driving circuit 323, and the measuring equipment 324.

The inspection electrode 321 can obtain an electric connection by physically contacting with the contact 120 formed in the FPC contact portion over the display device 311. The signal line driving circuit 314 and the row select line driving circuit 315 formed within the display device 311 are driven using the external driving circuit included in the inspection apparatus, and an electric characteristic of the signal line driving circuit 314 and the row select line driving circuit 315 is measured using the measuring equipment 324 included in the inspection apparatus.

As shown in FIG. 2, the contact by the conventional technique laminates the protective conductive film 103 over the metal film 102 and takes a structure to cover a periphery of the metal film 102 with the protective film 110 and the interlayer insulating film 109 to prevent the corrosion and the oxidation of the metal film 102. Furthermore, the protective conductive film 103 has a high hardness; therefore, the damage of the contact surface formed by contacting with the inspection electrode 321 damage of the contact surface formed by contacting with the inspection electrode 321 of the inspection apparatus 322 can be prevented in the case of carrying out the operation at the point that the signal line driving circuit 314 and the row select line driving circuit 315 are advanced to a step capable for operating. However, a protective conductive film has a high resistivity; therefore, there is a problem that the contact resistivity with the FPC gets higher and the power consumption gets bigger in the condition of using the display device.

Figure 1:
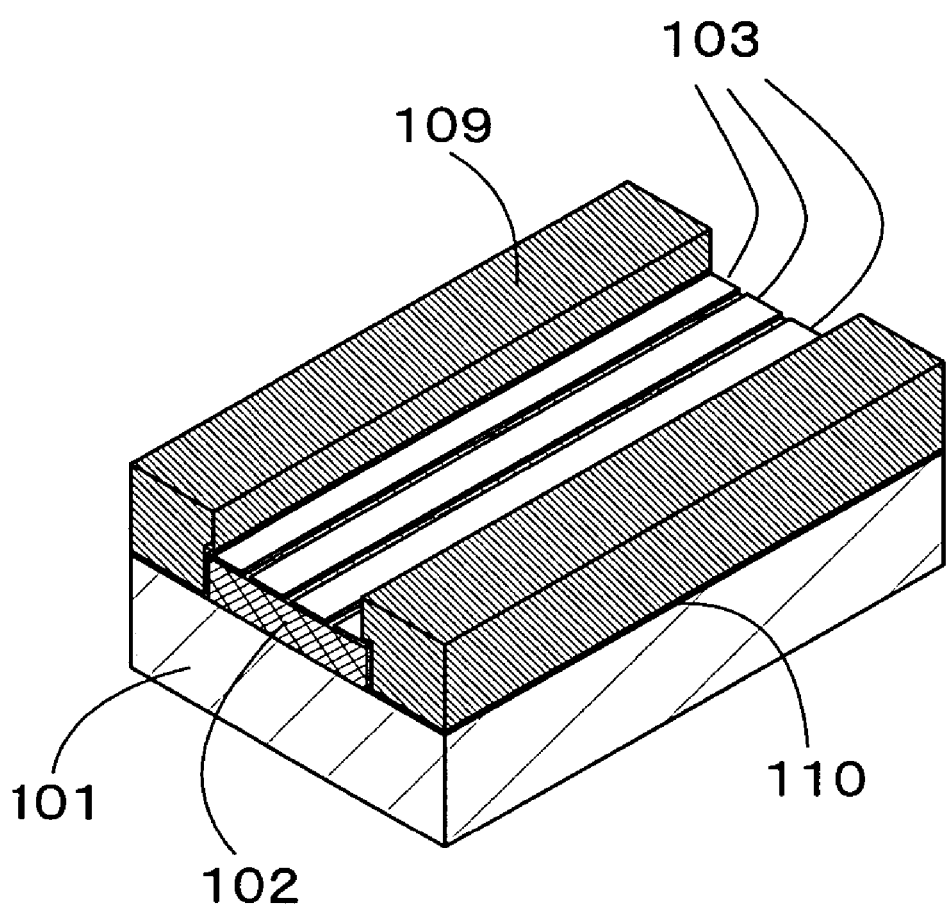
FIG. 1 is an oblique perspective view illustrating a contact structure of the present invention.
Figure 2:
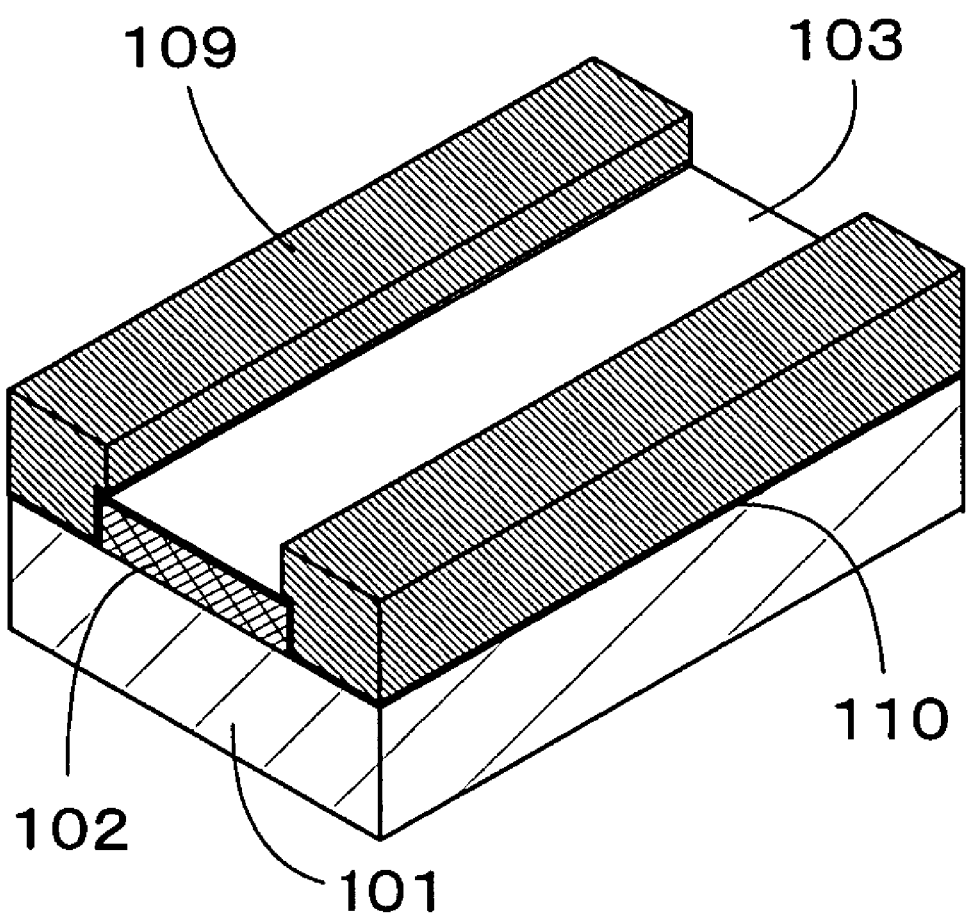
FIG. 2 is a drawing illustrating a contact structure by the conventional technique.

In the present embodiment mode, difference between the contact structure of the prior art and that of the present invention is described using FIG. 1 and FIG. 2. FIG. 1 shows an oblique perspective view enlarged a periphery of the contact 120 placed at the FPC contact portion 316 in FIG. 7. FIG. 2 is a figure shown alike regarding the FPC contact portion formed by a conventional structure. A contact that laminated the metal film 102 and the protective conductive film 103 is formed over the substrate 101. The protective conductive film 103 is formed uniformly over the metal film 102 in the conventional technique (FIG. 2), however, the protective conductive film 103 is formed in a slit shape in the present invention (FIG. 1).

In the present invention, the metal film 102 is not limited to a single layer. As an example of the metal film, a metal layer containing element such as aluminum (Al); tantalum (Ta); titanium (Ti); molybdenum (Mo); and tungsten (W) as its main component, and an alloy layer including a metal element can be given. As the metal film, a conductive film formed with material having conductivity and low resistivity may be also used.

In the present invention, the protective conductive film 103 is used with the purpose to protect the metal film 102, and it is preferable to be material having conductivity and material having a higher hardness than that of the metal film 102 and strong in the oxidation and the corrosion. As an example of the protective conductive film, indium oxide and indium tin oxide (ITO); indium zinc oxide; zinc oxide; and the like can be given.

FIG. 4 is a cross-sectional view of the contact portion (A-A' part of FIG. 7) according to the present invention after bonding the FPC. The anisotropic conductive film 107 including the conductive particle 108 over the contact that is formed over the substrate 101 with the metal film 102 and the protective conductive film 103 is formed; therefore the contact is electrically connected with the wiring 106 formed over the substrate 105 of the FPC 104.

FIG. 5 shows a cross-sectional view taken along with B-B' part of FIG. 6. The protective conductive film 103 has a slit shape and a width of a part that the protective conductive film 103 is not formed is formed to be narrower than that of the inspection electrode 321 of the inspection apparatus as shown in FIG. 5. It is also formed to be wider than a space necessary for an electrical connection between the metal film 102 by the conductive particle 108 included in the anisotropic conductive film 107 and the wiring 106 of the FPC 104 as shown in FIG. 4.

The conductive particle 108 is squashed at boding the FPC; therefore, the width of the protective conductive film 103 that the protective conductive film 103 is not formed may not necessarily be wider than that of a diameter of the conductive particle 108. A minimum width of the protective conductive film 103 that the protective conductive film 103 is not formed can get in a slit part that the protective conductive film 103 is not formed in the condition that the conductive particle 108 is squashed and may be a width necessary for electrically contacting with the metal film 102.

Both of the protective conductive film 103 formed in the slit shape and the metal film 102 are contacted with the conductive particle 108 in the connection part with the anisotropic conductive film 107 by forming the protective conductive film 103 in the slit shape (FIG. 4). However, the inspection electrode 321 of the inspection apparatus is only contacted with the protective conductive film 103 but not with the metal film 102 (FIG. 5).

In the present embodiment mode, the display device 311 including the signal line driving circuit 314, the row select line driving circuit 315, and the pixel 313 of FIG. 7 is illustrated as an example. However, the present invention is also applicable to the display device that does not include the signal line driving circuit 314 and the row select line driving circuit 315, and a display device that is formed together with CPU; memory; data processing circuit; and the like over one substrate in addition to the signal line driving circuit 314 and the row select line driving circuit 315.

Embodiment Mode 2

In the Embodiment Mode 2, an example of a substrate; an electronic component; an electronic device; electronic equipment; and the like connected by the contact portion composed of the contact structure of the present invention and other conductor will be described using FIGS. 8A and 8B.

Figure 8A:
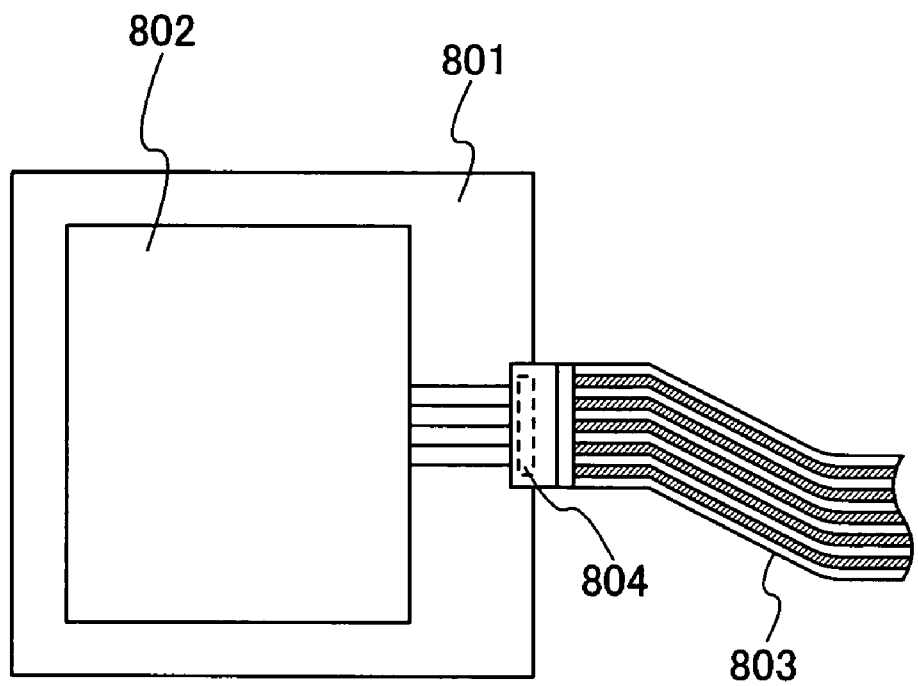
FIGS. 8A and 8B are examples of a circuit substrate connected by a contact portion having a contact structure of the present invention.

In FIG. 8A, a circuit 802 and a contact portion 804 are formed together over a circuit substrate 801. The contact portion 804 shown in a wavy line takes a structure as shown in FIG. 4, and connected with the FPC 803 in the contact portion 804.

Both of the protective conductive film and the metal film are electrically connected with the conductive particle in the contact portion 804; therefore, it is possible to connect with other substrate without involving the protective conductive film with high resistivity. Furthermore, the inspection electrode is not contacted directly with metal of the contact portion even inspecting an electric characteristic of the circuit 802 is inspected by contacting the inspection electrode at the contact portion before connecting the FPC as described in Embodiment Mode 1. Therefore, the damage of the contact portion can be prevented.

In addition, a display device 806, and contact portions 809 and 810 are totally formed over a substrate 805 in FIG. 8A, and a photodiode 807 in the contact portion 809 and a IC (integrated circuit) in the contact portion 810 are connected.

Current detected in the photodiode is slight; therefore, such contact portion having low resistivity as in the present invention is extremely effective.

It should be noted that connected in the contact portion is not limited to the circuit substrate 801 and the FPC 803; the substrate 805; the photodiode 807; and the IC 808, and a printed substrate; a programmable logic device substrate (FPGA (Field Programmable Gate Array) and CPLD (Complex Programmable Logic Device) may be capable. It may be electronic component; an electronic device; an electronic appliance; and the like that is connected in such a contact portion.

Figure 8B:
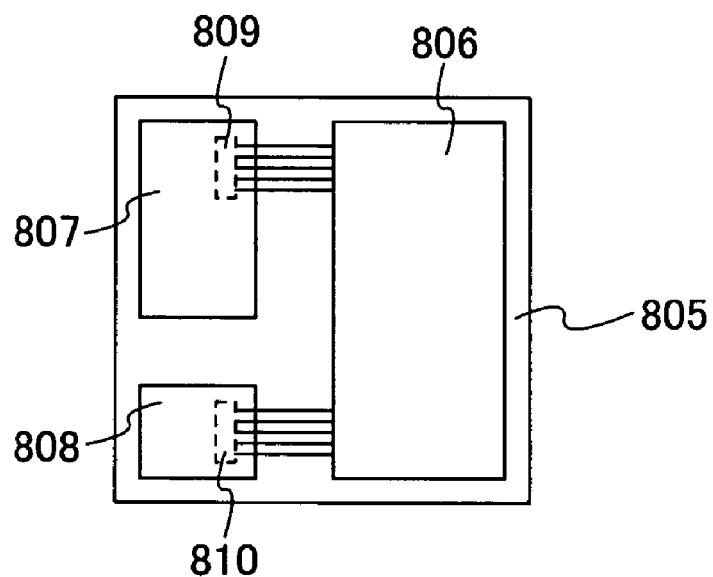

A structure connected with other conductor in the contact portion having at the edge of the substrate as shown in FIG. 8A, and a structure having other conductor over a substrate as shown in FIG. 8B can be combined appropriately. The contact portion can be inspected without being damaged before connecting the conductor by having such a contact portion, and can save power consumption.

Both of the protective conductive film and the metal film are electrically connected with the conductive particle by utilizing the present invention; therefore, it is possible to connect with other substrate without involving the protective conductive film with high resistivity. Furthermore, there is the protective conductive film with a high hardness in the surface of the contact; therefore, it can prevent the surface of the contact from being damaged by the inspection electrode of the inspection apparatus. Accordingly, the metal film can be prevented from scrapping to be flown in all direction. In addition, the connect resistivity of the contact and the FPC can be decreased; therefore, it is possible to reduce the power consumption of the display device.

Embodiment

Electronic devices to which the present invention is applied may be given as a video camera, a digital camera, a goggles-type display (head mount display), a navigation system, a sound reproduction device (such as a car audio device and an audio set), a lap-top computer, a game machine, a portable information terminal such as a mobile computer, a mobile telephone, a portable game machine, an electronic book, and an image reproduction device including a recording medium (more specifically, an device which can reproduce a recording medium such as a digital versatile disc (DVD) and so forth, and a display for displaying the reproduced image), or the like. Specific examples thereof are shown in FIGS. 9A to 9H.

Figure 9A:
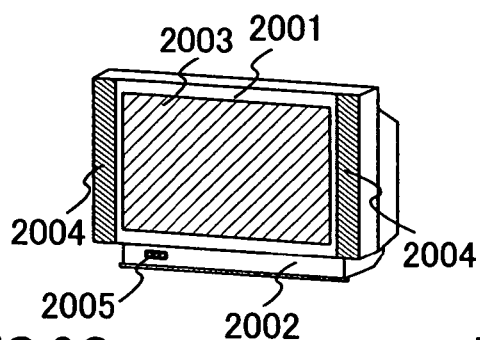
FIGS. 9A to 9H are diagrams of electronic devices to which the present invention is applied.

FIG. 9A illustrates an electronic device which includes a casing 2001, a support table 2002, a display portion 2003, a speaker portion 2004, a video input terminal 2005 and the like. When the light-emitting device is used for the display portion, the light-emitting device is of the self-emission-type and therefore requires no backlight. Thus, the display portion thereof can have a thickness thinner than that of the liquid crystal display device. The electronic device is including the entire display device for displaying information, such as a personal computer, a receiver of TV broadcasting and an advertising display.

Figure 9B:
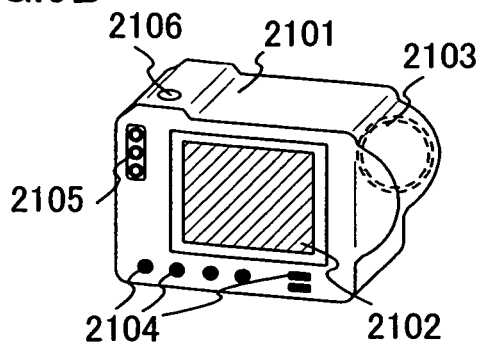

FIG. 9B illustrates a digital still camera which includes a main body 2101, a display portion 2102, an image receiving portion 2103, operation keys 2104, an external connection port 2105, a shutter 2106, and the like.

Figure 9C:
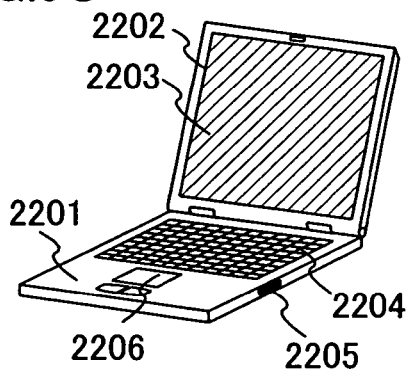

FIG. 9C illustrates a lap-top computer which includes a main body 2201, a casing 2202, a display portion 2203, a keyboard 2204, an external connection port 2205, a pointing mouse 2206, and the like.

Figure 9D:
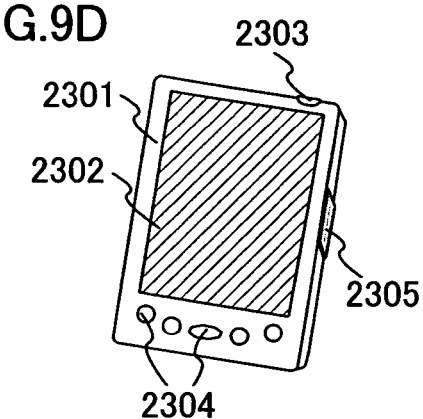

FIG. 9D illustrates a mobile computer which includes a main body 2301, a display portion 2302, a switch 2303, operation keys 2304, an infrared port 2305, and the like.

Figure 9E:
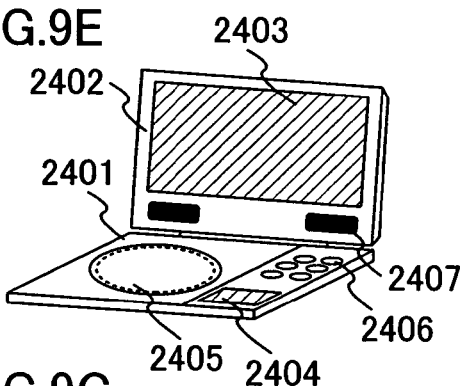

FIG. 9E illustrates a portable image reproduction device including a recording medium (more specifically, a DVD reproduction device), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. The image reproduction device including a recording medium further includes a game machine or the like.

Figure 9F:
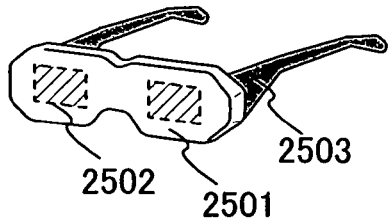

FIG. 9F illustrates a goggle type display (head mounted display) which includes a main body 2501, a display portion 2502, an arm portion 2503, and the like.

Figure 9G:
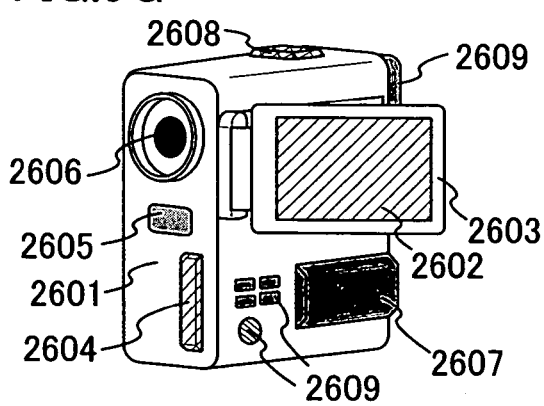

FIG. 9G illustrates a video camera which includes a main body 2601, a display portion 2602, a casing 2603, an external connecting port 2604, a remote control receiving portion 2605, an image receiving portion 2606, a battery 2607, a sound input portion 2608, operation keys 2609, and the like.

Figure 9H:
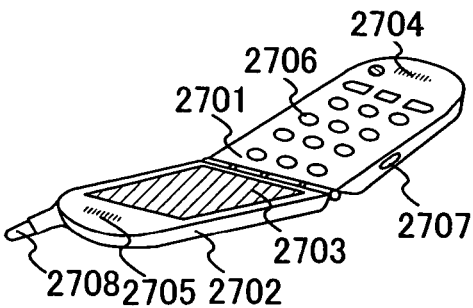

FIG. 9H illustrates a mobile telephone which includes a main body 2701, a casing 2702, a display portion 2703, a sound input portion 2704, a sound output portion 2705, operation keys 2706, an external connecting port 2707, an antenna 2708, and the like. Note that the display portion 2703 can reduce power consumption of the mobile telephone by displaying white-colored characters on a black-colored background.

When a brighter luminance of light-emitting materials becomes available in the future, the light-emitting device will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. Since the response speed of the light-emitting materials is very high, the light-emitting device is preferably used for moving picture display.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a mobile telephone or a sound reproduction device, it is desirable to drive the light-emitting device so that the character information is formed by a light-emitting portion while a non-emission portion corresponds to the background.

As set forth above, the present invention can be applied variously to a wide range of electronic devices in all fields. The electronic devices in this embodiment can be obtained by utilizing the device having the contact structure of the present invention.

What is claimed is:

1. A display device comprising:
    a contact portion that electrically connects with a conductor through an anisotropic conductive film comprising a conductive particle,
    wherein the contact portion is composed of a laminated layer of a metal film and a protective conductive film;
    wherein the protective conductive film has a plurality of slits in the contact portion; and
    wherein the metal film is in contact with the conductive particle in at least one of the slits of the protective conductive film.

2. A display device according to claim 1, wherein the display device is a liquid crystal display device.

3. A display device according to claim 1, wherein the display device is an electroluminescence display device.

4. Electronic device using a display device according to claim 1.

5. Electronic device according to claim 4, wherein the electronic device is a video camera, a digital camera, a goggles-type display, a navigation system, a sound reproduction device, a lap-top computer, a game machine, a portable information terminal, a mobile telephone, a portable game machine, an electronic book, or an image reproduction device including a recording medium.

6. A display device comprising:
    a contact portion formed of a laminated layer of a metal film and a protective conductive film having a plurality of slits in the contact portion,
    wherein the contact portion is electrically connected with a conductor through an anisotropic conductive film comprising a conductive particle;
    wherein the protective conductive film has a higher hardness than that of the metal film; and
    wherein the metal film is in contact with the conductive particle in at least one of the slits of the protective conductive film.

7. A display device according to claim 6, wherein the contact portion is electrically connected with a circuit substrate.

8. A display device according to claim 6, wherein the contact portion is electrically connected with an external wiring.

9. A display device according to claim 6, wherein the contact portion is electrically connected with a flexible printed circuit.

10. A display device according to claim 6, wherein the contact portion is electrically connected with a semiconductor integrated circuit.

11. A display device according to claim 6, wherein the display device is a liquid crystal display device.

12. A display device according to claim 6, wherein the display device is an electroluminescence display device.

13. Electronic device using a display device according to claim 6.

14. Electronic device according to claim 13, wherein the electronic device is a video camera, a digital camera, a goggles-type display, a navigation system, a sound reproduction device, a lap-top computer, a game machine, a portable information terminal, a mobile telephone, a portable game machine, an electronic book, or an image reproduction device including a recording medium.

15. A display device according to claim 1, further comprising:
    a pixel portion having a plurality of pixels placed in a matrix configuration;

a first driving circuit that puts a signal in each pixel column of the pixel portion; and a second driving circuit that puts a signal in each pixel row of the pixel portion.

16. A display device according to claim 6, further comprising:
a pixel portion having a plurality of pixels placed in a matrix configuration;
a first driving circuit that puts a signal in each pixel column of the pixel portion; and
a second driving circuit that puts a signal in each pixel row of the pixel portion.

17. A semiconductor device according to claim 1,
wherein the protective conductive film comprises a material selected from the group consisting of indium oxide, indium thin oxide, indium zinc oxide and zinc oxide.

18. A semiconductor device according to claim 6,
wherein the protective conductive film comprises a material selected from the group consisting of indium oxide, indium thin oxide, indium zinc oxide and zinc oxide.

19. A display device comprising:
a pixel portion having a pixel;
a driver circuit transferring a signal of image to the pixel; and
a contact portion electrically connected to of a conductor through an anisotropic conductive film comprising a conductive particle,
wherein the contact portion comprises a metal film and a protective conductive film;
wherein the protective conductive film has a plurality of slits in the contact portion; and
wherein the metal film is in contact with the conductive particle in at least one of the slits of the protective conductive film.

20. A display device according to claim 19, wherein the display device is a liquid crystal display device.

21. A display device according to claim 19, wherein the display device is an electroluminescence display device.

22. Electronic device using a display device according to claim 19.

23. Electronic device according to claim 22, wherein the electronic device is a video camera, a digital camera, a goggles-type display, a navigation system, a sound reproduction device, a lap-top computer, a game machine, a portable information terminal, a mobile telephone, a portable game machine, an electronic book, or an image reproduction device including a recording medium.

24. A semiconductor device according to claim 19,
wherein the protective conductive film comprises a material selected from the group consisting of indium oxide, indium thin oxide, indium zinc oxide and zinc oxide.

25. A display device comprising:
a pixel portion having a pixel;
a driver circuit transferring a signal of image to the pixel; and
a contact portion comprising a metal film and a protective conductive film having a plurality of slits in the contact portion,
wherein the contact portion is electrically connected to a conductor through an anisotropic conductive film comprising a conductive particle;
wherein the protective conductive film has a higher hardness than that of the metal film; and
wherein the metal film is in contact with the conductive particle in at least one of the slits of the protective conductive film.

26. A display device according to claim 25, wherein the contact portion is electrically connected with a circuit substrate.

27. A display device according to claim 25, wherein the contact portion is electrically connected with an external wiring.

28. A display device according to claim 25, wherein the contact portion is electrically connected with a flexible printed circuit.

29. A display device according to claim 25, wherein the contact portion is electrically connected with a semiconductor integrated circuit.

30. A display device according to claim 25, wherein the display device is a liquid crystal display device.

31. A display device according to claim 25, wherein the display device is an electroluminescence display device.

32. Electronic device using a display device according to claim 25.

33. Electronic device according to claim 32, wherein the electronic device is a video camera, a digital camera, a goggles-type display, a navigation system, a sound reproduction device, a lap-top computer, a game machine, a portable information terminal, a mobile telephone, a portable game machine, an electronic book, or an image reproduction device including a recording medium.

34. A semiconductor device according to claim 25,
wherein the protective conductive film comprises a material selected from the group consisting of indium oxide, indium thin oxide, indium zinc oxide and zinc oxide.

* * * * *